US006479347B1

(12) United States Patent
Dalla Libera et al.

(10) Patent No.: US 6,479,347 B1
(45) Date of Patent: Nov. 12, 2002

(54) SIMPLIFIED DSCP PROCESS FOR MANUFACTURING FLOTOX EEPROM NON-AUTOALIGNED SEMICONDUCTOR MEMORY CELLS

(75) Inventors: Giovanna Dalla Libera, Monza; Bruno Vajana, Bergamo, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/419,617

(22) Filed: Oct. 14, 1999

(30) Foreign Application Priority Data

Oct. 15, 1998 (EP) .............................. 98830612

(51) Int. Cl.$^7$ ............................................ H01L 21/336
(52) U.S. Cl. ................. 438/258; 438/201; 438/257; 438/264; 438/266; 438/594
(58) Field of Search ...................... 438/201, 257, 438/258, 264, 266, 593, 594

(56) References Cited

U.S. PATENT DOCUMENTS

| 5,066,992 A |  | 11/1991 | Wu et al. .................... 357/23.5 |
| 5,404,037 A |  | 4/1995 | Manley ........................ 257/321 |
| 5,656,845 A |  | 8/1997 | Akbar .......................... 257/347 |
| 5,702,964 A | * | 12/1997 | Lee ............................. 438/257 |
| 5,861,347 A | * | 1/1999 | Maiti et al. .................. 438/787 |
| 6,087,211 A | * | 7/2000 | Kalnitsky et al. ............ 438/232 |
| 6,159,795 A | * | 12/2000 | Higashitani et al. ......... 438/257 |
| 2001/0004120 A1 | * | 6/2001 | Colclaser et al. ............ 257/326 |

FOREIGN PATENT DOCUMENTS

EP            0 422 606 A2       4/1991

* cited by examiner

Primary Examiner—Carl Whitehead, Jr.
Assistant Examiner—Toniae M. Thomas
(74) Attorney, Agent, or Firm—Lisa K. Jorgenson; Robert Ianucci; Seed Intellectual Property Law Group PLLC

(57) ABSTRACT

A simplified DSCP process makes non-self-aligned floating gate semiconductor memory cells of the FLOTOX EEPROM type as incorporated to a cell matrix having control circuitry associated therewith, wherein each cell has a selection transistor associated therewith. The process includes at least the following steps: growing or depositing a gate dielectric layer of the selection transistor and the cell; tunnel masking to define the tunnel area with a dedicated etching step for cleaning the semiconductor surface; growing the tunnel oxide; depositing and doping the first polysilicon layer poly1. The process further comprises the following steps: poly1 masking to fully define the floating gate of the cell, the poly1 being removed from the area of the selection transistor during this step; depositing or growing the interpoly dielectric and forming tunnel oxide and interpoly dielectric; depositing or growing the interpoly dielectric and forming the overall gate dielectric of the selection transistor, which will therefore consist of the stacked interpoly dielectric and gate dielectric as previously grown or deposited; matrix masking to only remove interpoly dielectric from the circuitry; depositing and doping a second polysilicon layer poly2; masking the second layer of polysilicon to define the control and selection gate; poly etching in the matrix as far down as the intermediate dielectric layer; poly etching in the circuitry the whole short-circuited poly1/poly2 stack.

15 Claims, 3 Drawing Sheets

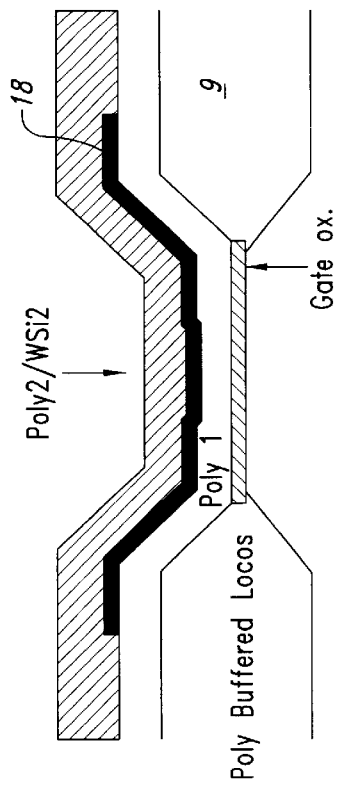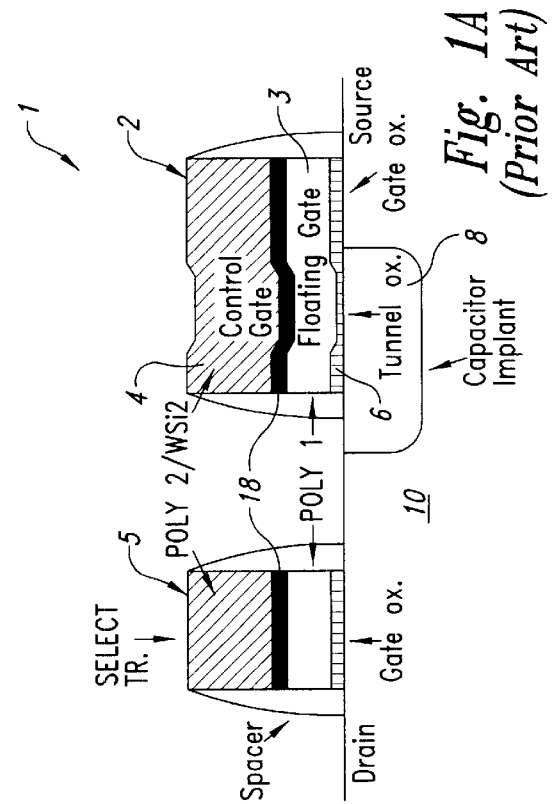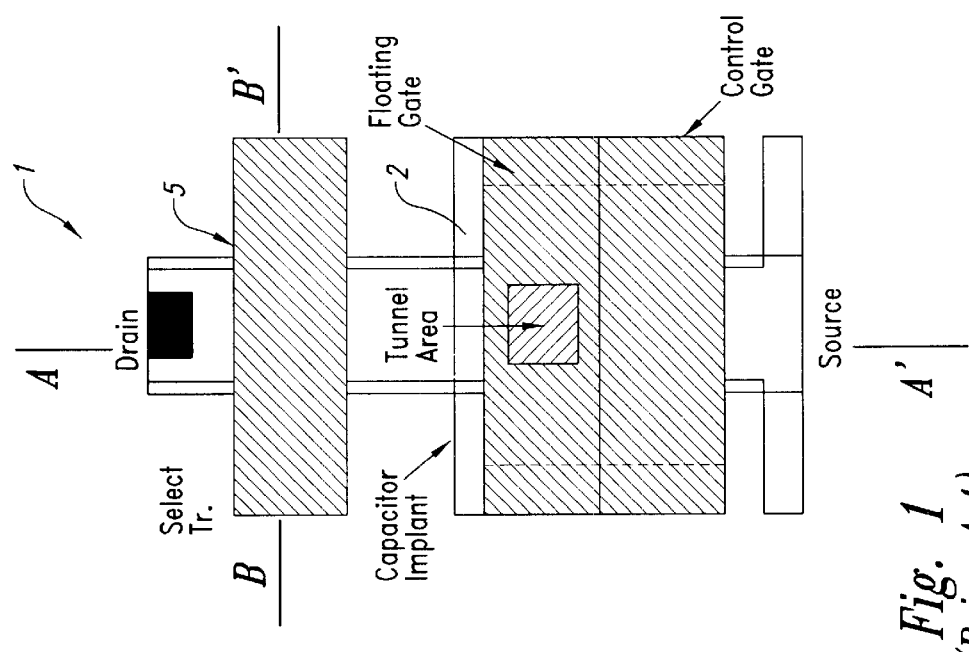

SIMPLIFIED DSCP PROCESS FOR MANUFACTURING FLOTOX EEPROM NON-AUTOALIGNED SEMICONDUCTOR MEMORY CELLS

TECHNICAL FIELD

This invention relates to a simplified DSCP (Double Short-Circuited-Poly) process for making non-self-aligned semiconductor memory cells of the FLOTOX EEPROM type.

BACKGROUND OF THE INVENTION

There exists a well-recognized demand, from the semiconductor integrated circuit market, for large capacity (>256 kbit) EEPROM devices. This implies increased effort on the part of the manufacturers of such circuits to provide circuit devices of an ever smaller size.

A memory cell of the EEPROM type comprises a field-effect transistor having a floating gate which is coupled capacitively to a control gate terminal. This floating gate transistor is connected in series with a selection transistor.

The floating gate comprises a first layer of polysilicon, referred to as the poly1, and the control gate comprises an overlying second layer of polysilicon, or poly2. Whereas in the memory cell the poly1 and poly2 layers are isolated by an intermediate dielectric (interpoly) layer, in the selection transistor these layers are in contact with each other.

A DSCP process flow requires that the first polysilicon layer of the selection transistor associated with the memory cell be contacted, for otherwise, the selection transistor would be floating all the time. A special mask (matrix mask) is used for this purpose which allows the poly1 and poly2 layers to be short-circuited by removal of the intermediate dielectric layer from appropriate areas, for example, every n bytes.

In this way, the poly1 layer of the selection transistor is coupled to a signal transmitted by the poly2 layer through the direct contact with the poly2 layer.

In a standard DSCP process, the control gate and select regions are defined by means of a special etching step, known as the self-aligned etch, whereby the stacked poly1/interpoly/poly2 layers are etched sequentially and are vertically aligned. For this reason, the distance of the selection transistor from the memory cell proper should be adequate to prevent short-circuiting of the respective gates, as may be due to polysilicon left over from the self-aligned etch.

In theory, a non-self-aligned cell could be used to define the selection and control gate regions by specific etching steps, to eliminate the problem caused by poly residue. But in a DSCP process, such a solution would entail a serious loss in circuit area.

In addition, a self-aligned process leaves ditches in the source line, which can result in serious malfunctioning of the memory device.

SUMMARY OF THE INVENTION

Embodiments of this invention provide a simplified DSCP process which has such features as to allow non-self-aligned semiconductor memory cells of the FLOTOX EEPROM type to be made, while keeping the cell bulk low.

One of the concepts behind embodiments of this invention is to incorporate steps of a non-self-aligned process to a DSCP process, thereby obviating the aforementioned drawbacks of self-aligned processes and the need for increased overall bulk of the cell.

The features and advantages of a process according to the invention will be apparent from the following description of an embodiment thereof, given by way of non-limitative example with reference to the accompanying drawings.

BRIEF DESCRIPTION OF THE DRAWINGS

FIG. 1 is a layout view from above illustrating a portion of a known semiconductor integrated circuit which includes at least one EEPROM cell formed by a DSCP process and having a selection transistor associated therewith.

FIG. 1A is a cross-sectional view, taken along line A—A' of FIG. 1, illustrating schematically the same integrated circuit portion shown in FIG. 1.

FIG. 1B is a cross-sectional view, taken along line B—B' of FIG. 1, illustrating schematically the same integrated circuit portion shown in FIG. 1.

DETAILED DESCRIPTION

Figure 2A:
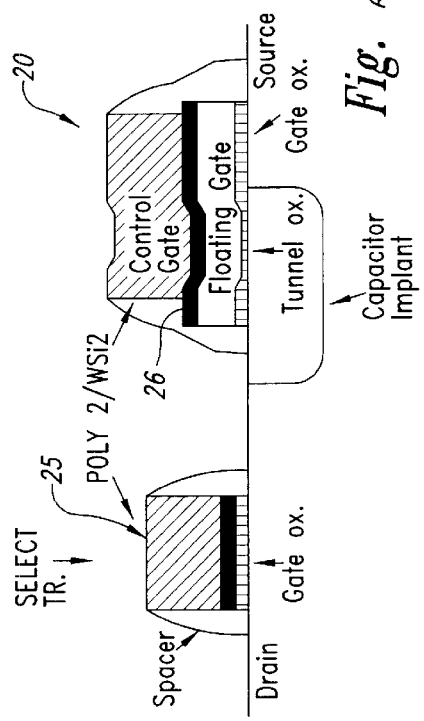
FIG. 2A is a cross sectional view, taken along line A—A' of FIG. 2, illustrating schematically the same integrated circuit portion as in FIG. 2.

The process steps and structures described herein below do not reflect a complete fabricating process for integrated circuits. This invention can be practiced in conjunction with such integrated circuit fabrication techniques as are commonly employed in this field, and only such common process steps will be discussed as are necessary to an understanding of the invention. Discussion of steps well known to those skilled in the art have been abbreviated or eliminated for brevity. Those drawing figures wherein cross-sections through portions of an integrated circuit being fabricated are shown, are not drawn to scale but rather to highlight major features of the embodiments of the invention.

Referring to the figures generally, the steps will now be described for forming non-self-aligned EEPROM cells 1 within a CMOS process of the DSCP type as provided for making the circuitry associated with the matrix.

Referring in particular to the example of FIG. 1, the structure of a conventional single EEPROM cell will be discussed first which comprises a field-effect transistor 2 having a floating gate 3 coupled capacitively to a control gate terminal 4. This floating gate transistor 2 is connected in series with a selection transistor 5.

The floating gate 3, whereinto the charges are stored, is formed of a first poly1 layer, while the control gate 4 is formed of a second poly2/Wsi$_2$ layer. A thin tunnel oxide layer 6, having a thickness of about 80 Angstroms is provided between the floating gate 3 and the semiconductor substrate 10. The electric charges are passed through this tunnel oxide 6 by Fowler-Nordheim effect during the step of programming the memory cell 1.

A diffused area 8, formed in the substrate 10 and partway underlying the gate region, is intended for a capacitor implant effective to maintain electric continuity between the bit line selection transistor 5 and the tunnel area 6.

Shown in FIG. 1A is a cross-section taken through the cell and the selection transistor along a line A—A' drawn perpendicularly to the poly strips. As can be seen from this cross-sectional view, the profile of the poly/interpoly/poly2/WSi2 stack is essentially vertical as a result of the self-aligned etch.

FIG. 1B is instead a cross-section taken through the cell and the selection transistor along a line B—B' drawn parallel to the poly strips. As can be appreciated from this cross-sectional view, due to the matrix mask, the poly1 and poly2/Wsi$_2$ layers of the selection transistor are short-circuited together, in this case at the area overlying the field oxide 9.

The prior art memory cell considered here with reference to FIGS. 1, 1A and 1B is formed by a standard CMOS process of the DSCP type, wherein the following steps are carried out, starting with a substrate of the P type, as required for forming the EEPROM cells: masking for capacitor implantation and related implanting; growing or depositing the dielectric which is to form the gate dielectric for the selection transistor 5 and the cell 1; tunnel masking in order to define the tunnel area, with dedicated silicon surface cleaning etch; growing the tunnel oxide; depositing and doping the first polysilicon layer; poly1 masking to define the floating gate 3 in the perpendicular direction to the poly strips, i.e. along the direction A—A' in FIG. 1A; forming the interpoly dielectric 18, either by deposition or growth thereof; matrix masking to remove the interpoly dielectric from the areas that are to be matrix and circuitry DSCP'ed; depositing the second layer of polysilicon, with related doping, to simultaneously form the control gate 4 and the gate of the selection transistor; masking the second layer of polysilicon to define the control gate 4 and selection gate; etching the matrix and circuitry poly; masking for self-aligned etching; and self-aligned matrix etching.

The process is continued through further standard steps, not described herein because quite conventional.

Advantageously in embodiments of this invention, the standard DSCP process flow is modified to produce a non-self-aligned FLOTOX EEPROM cell.

These principles apply equally well to embodiments of the invention, two of which are as described herein below.

A first embodiment will now be described with joint reference to FIGS. 2, 2A and 2B. FIG. 2 is a plan view of the layout of an EEPROM cell 20 according to this embodiment of the invention. In this case, the selection transistor 25 has for its gate dielectric the stack of the gate oxide and intermediate dielectric, and the gate only comprises the poly2/Wsi$_2$ layer. From the cross-sectional view in the direction A—A' shown in FIG. 2A, it can be seen that the profile of the cell gate region is non-vertical, and exhibits a step 26 because the cell is not self-aligned. The poly2/Wsi$_2$ layer of the cell 20 is definitely separated from the poly2/Wsi$_2$ of the selection transistor 25 because the two gates are located at different levels (i.e. one above the other). This avoids the risk of a short-circuit occurring due to any left-overs from the poly2/Wsi$_2$ etch.

The poly1 layer of the floating gate of the cell 20 locates at the same height as the poly2/Wsi$_2$ of the selection transistor 25, but shorting problems can be ruled out between the two gates because the two poly's are separated by the interpoly dielectric.

Figure 3B:
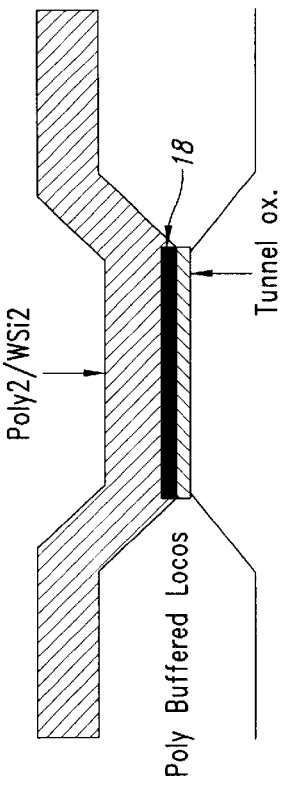
FIG. 3B is a cross-sectional view, taken along line B—B' of FIG. 3, illustrating schematically the same integrated circuit portion as in FIG. 3.
Figure 3A:
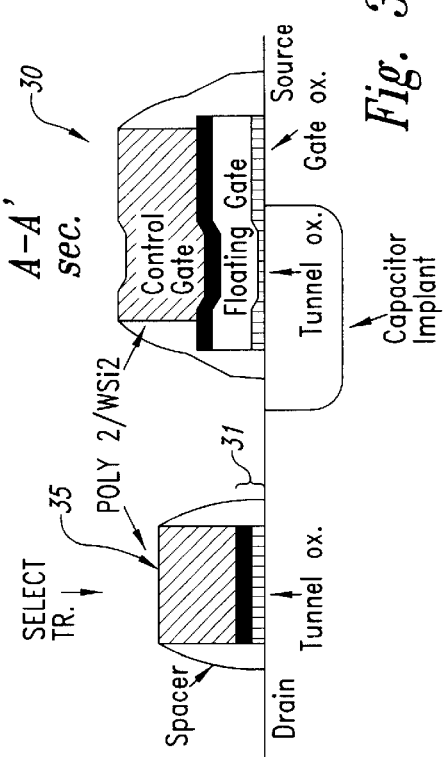
FIG. 3A is a cross-sectional view, taken along line A—A' of FIG. 3, illustrating schematically the same integrated circuit portion as in FIG. 3.
Figure 3:
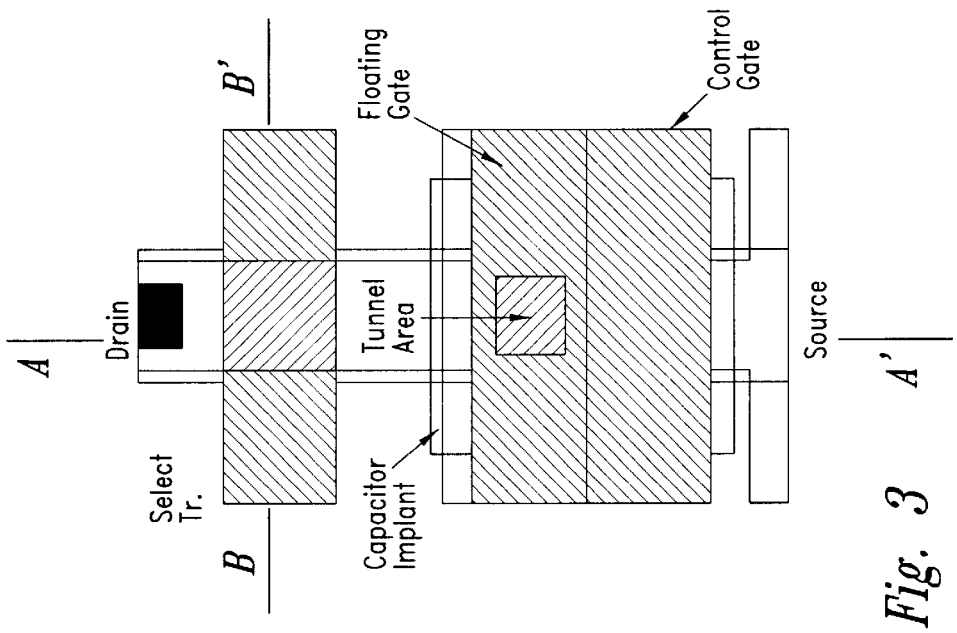
FIG. 3 is a layout view from above illustrating a portion of a semiconductor integrated circuit which includes at least one EEPROM cell formed in accordance with an embodiment of this invention and having a selection transistor associated therewith.

Shown in plan view in FIG. 3 is the structure of a cell 30 formed according to a second embodiment of this invention.

FIG. 3A is a cross-sectional view of the cell 30 and relating selection transistor, taken along the line A—A' which is perpendicular to the poly strips.

FIG. 3B is a cross-sectional view of the cell 30 and related selection transistor 35, taken along the line B—B', in a parallel direction to the poly strips.

Figure 2B:
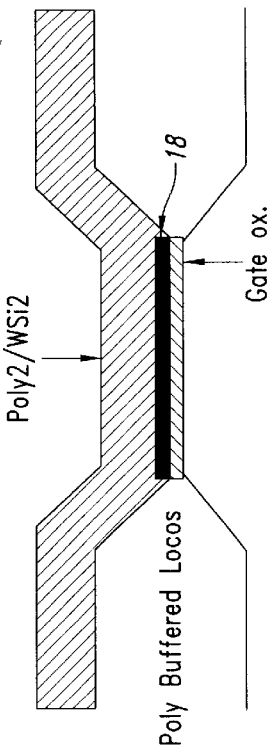
FIG. 2B is a cross sectional view, taken along line B—B' of FIG. 2, illustrating schematically the same integrated circuit portion as in FIG. 2.
Figure 2:
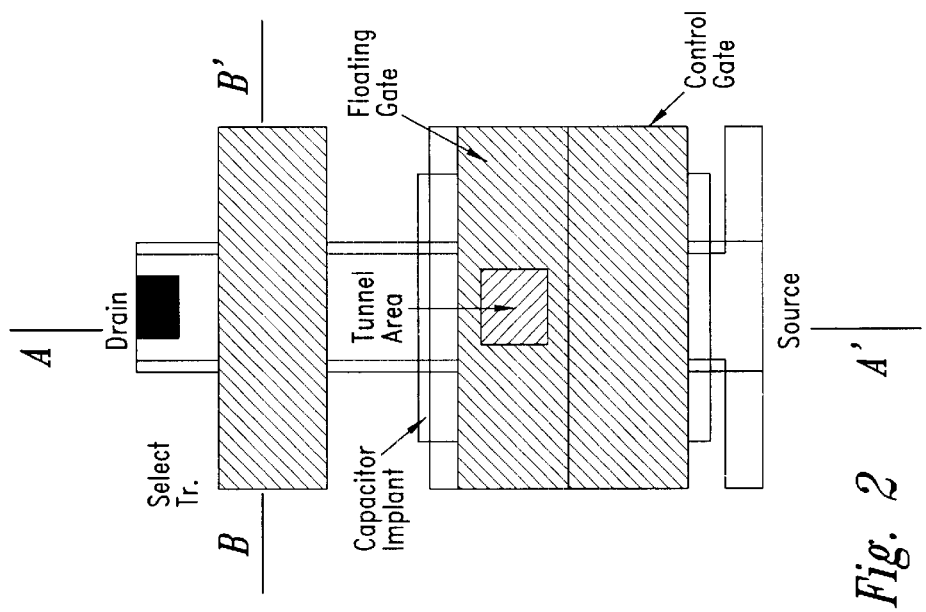
FIG. 2 is a layout view from above illustrating a portion of a semiconductor integrated circuit which includes at least one EEPROM cell formed in accordance with embodiments of this invention and having a selection transistor associated therewith.

The shape of the gate of the selection transistor 35, the floating gate and the control gate of the cell 30 are identical with the previous embodiment illustrated in FIGS. 2, 2A and 2B. A gate oxide 31 of the selection transistor 35 is, however, thinner than in the previous case because it results from the superposition of the tunnel oxide and the interpoly dielectric 18.

In either of the embodiments illustrated in the figures, the distance between the gate of the selection transistor and the control gate and the floating gate of the cell is less than in conventional solutions and affords savings in total area.

The process flow according to the embodiments of the invention will now be described by drawing a parallel between the first and second embodiments, while pointing out the differences between these two process flows.

In the first embodiment (FIGS. 2, 2A and 2B) the following steps are carried out: growing or depositing the gate dielectric of the selection transistor and the cell;

tunnel masking to define the area where the tunnel oxide is to be grown;

growing the tunnel oxide; depositing and doping the first layer of polysilicon; poly1 masking to fully define the floating gate of the cell (during this step, the poly1 is removed from the area of the selection transistor; the poly1 is obviously allowed to stay over the entire circuitry area); depositing or growing the interpoly dielectric 18 and forming the overall gate dielectric of the selection transistor, (which will therefore consist of the stacked interpoly dielectric and gate dielectric as previously grown or deposited);

matrix masking to only remove interpoly dielectric from the circuitry;

depositing and doping the poly2/Wsi$_2$ layer; masking the second layer of polysilicon to define the control and selection gate; poly etching in the matrix and the circuitry (this etching of the matrix poly is stopped upon meeting the intermediate dielectric layer, that is, only the poly2/Wsi$_2$ is etched, whereas the whole short-circuited poly1/poly2/Wsi$_2$ stack is etched in the circuitry.)

Advantageously, the self-aligned mask provided for in the prior art process is no longer used. Also, the self-aligned etch is no longer required, and the process can be continued in the standard fashion.

As for the second embodiment (FIGS. 3, 3a and 3b), the process comprises the following steps: growing or depositing the gate dielectric of the selection transistor and the cell; tunnel masking to define the regions where the gate dielectric is etched in the tunnel area and the channel area of the selection transistor; growing the tunnel oxide; depositing and doping the first layer of polysilicon; poly1 masking to fully define the floating gate of the cell (during this step, the poly1 is removed from the area of the selection transistor; of course, the poly1 is left over the entire circuitry area); depositing or growing the interpoly dielectric and forming the overall gate dielectric of the selection transistor, (which will therefore consist of the stacked interpoly dielectric and the oxide as previously grown or deposited); matrix masking to only remove the interpoly dielectric from the circuitry; depositing and doping the poly2/wsi$_2$ layer; masking the second layer of polysilicon to define the control and selection gate; poly etching in the matrix and the circuitry (this matrix etch is stopped upon meeting the intermediate dielectric layer, that is, only the poly2/wsi$_2$ will be etched, whereas in the circuitry, the whole short-circuited poly1/poly2/wsi$_2$ stack is etched.)

The process flows proposed by embodiments of this invention enable, through their modifications, the fabrication of EEPROM cells of the FLOTOX type, and afford the following major advantages over the state of the art: enhanced potential for scaling because of the reduced unit dimensions of the memory cell/selection transistor combination; reduced number of masks; for example, the mask for self-aligned etching in the matrix is eliminated; and a simpler process is used because the complex step of the self-aligned etch has been eliminated.

These advantages outweigh any disadvantages from a possible increase in thickness of the gate dielectric of the selection transistor, with its attendant higher threshold. Thus, the embodiments of the invention allow non-self-aligned cells to be obtained within a DSCP process as provided for the circuitry associated with the matrix.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. A DSCP process for making non-self-aligned floating gate semiconductor memory cells of the FLOTOX EEPROM type incorporated in a cell matrix having control circuitry associated therewith, wherein each cell has a selection transistor associated therewith, the process comprising:
   on a semiconductor substrate, forming a first dielectric layer for a first selection transistor and for a first memory cell;
   masking the first dielectric layer with a tunnel mask to define a tunnel area;
   removing the first dielectric layer from the semiconductor substrate in the tunnel area;
   forming a tunnel oxide on the semiconductor substrate in the tunnel area;
   depositing a first polysilicon layer on the semiconductor substrate;
   masking the first polysilicon layer to define a floating gate of the first memory cell;
   removing the first polysilicon layer from an area of the first selection transistor;
   forming an interpoly dielectric layer disposed over the first polysilicon layer;
   masking the interpoly dielectric layer with a matrix mask;
   removing the interpoly dielectric layer from the associated control circuitry and defining the gate dielectric for the first selection transistor;
   defining an overall gate dielectric for the first selection transistor consisting of the interpoly dielectric layer stacked on the first dielectric layer;
   forming a second polysilicon layer disposed over the interpoly dielectric layer;
   masking the second polysilicon layer to define a control gate for the first memory cell and for the first selection transistor; and
   etching the second polysilicon layer of the first memory cell down to the interpoly dielectric layer.

2. The process of claim 1 wherein the first dielectric layer is a gate oxide layer.

3. The process of claim 1 wherein the first dielectric layer, the tunnel oxide, and the interpoly dielectric layer are all grown.

4. The process of claim 1 wherein the first dielectric layer, the tunnel oxide, and the interpoly dielectric layer are all deposited.

5. A DSCP process for making non-self-aligned floating gate semiconductor memory cells of the FLOTOX EEPROM type that are incorporated in a cell matrix having control circuitry associate therewith, wherein each memory cell has a selection transistor associate therewith, the process comprising:
   forming a gate dielectric layer for one of the memory cells and its associated selection transistor;
   masking the gate dielectric layer with a tunnel mask to define tunnel regions;
   etching the gate dielectric in the tunnel regions of the one of the memory cells and in a channel area of the associated selection transistor;
   growing a tunnel oxide in the tunnel regions;
   depositing and doping a first layer of polysilicon on the semiconductor;
   masking the first layer of polysilicon to fully define a floating gate of the one of the memory cells;
   removing the first layer of polysilicon from an area of the associated selection transistor;
   forming an interpoly dielectric and forming the overall gate dielectric of the selection transistor consisting of the interpoly dielectric stacked with the tunnel oxide as previously formed;
   matrix masking to only remove the interpoly dielectric from the associated control circuitry;
   depositing and doping a second layer of polysilicon;
   masking the second layer of polysilicon to define a control gate for the one of the memory cells and a selection gate for the associated selection transistor; and
   etching the second layer of polysilicon of the one of the memory cells as far down as the interpoly dielectric.

6. In a memory matrix of non-self-aligned, non-volatile memory cells having associated control circuitry, a method for making a memory cell and a related selection transistor, the method comprising:
   on a semiconductor substrate, forming a first dielectric layer;
   masking the first dielectric layer with a tunnel mask to define one or more tunnel areas;
   removing the first dielectric layer from the semiconductor substrate in the one or more tunnel areas;
   forming a tunnel oxide on the semiconductor substrate in the one or more tunnel areas;
   depositing a first polysilicon layer on the semiconductor substrate;

masking the first polysilicon layer to define a floating gate for the memory cell;

removing the first polysilicon layer from a gate area of the selection transistor;

forming an interpoly dielectric layer on the semiconductor substrate, the floating gate, and the first dielectric layer at the gate area of the selection transistor;

masking the interpoly dielectric layer with a matrix mask;

removing the interpoly dielectric layer from the substrate while leaving the interpoly dielectric layer on the floating gate and on the first dielectric layer at the gate area of the selection transistor;

forming a second polysilicon layer disposed over the interpoly dielectric layer;

masking the second polysilicon layer to define a control gate for the memory cell and to define a selection gate for the selection transistor; and etching the second polysilicon layer of the memory cell down to the interpoly dielectric layer.

7. The process of claim 6 wherein one of the tunnel areas is in an area of the semiconductor substrate where the selection transistor is formed.

8. The process of claim 6 wherein the first dielectric layer is a gate oxide layer.

9. The process of claim 6 wherein the first dielectric layer, the tunnel oxide, and the interpoly dielectric layer are all grown.

10. The process of claim 6 wherein the first dielectric layer, the tunnel oxide, and the interpoly dielectric layer are all deposited.

11. In a memory matrix of non-self-aligned, non-volatile memory cells, a method for making a memory cell and a related selection transistor, the method comprising:

forming on a semiconductor substrate a first gate dielectric layer of the selection transistor;

forming on the substrate a first gate dielectric layer of the memory cell;

forming a first polysilicon layer on the first gate dielectric layers and on the substrate;

removing the first polysilicon layer from first gate dielectric layer of the selection transistor and from the substrate while leaving the first polysilicon layer as a floating gate on the first gate dielectric layer of the memory cell;

forming an interpoly dielectric layer on the semiconductor substrate, the floating gate, and the first gate dielectric layer of the selection transistor;

removing the interpoly dielectric layer from the substrate while leaving the interpoly dielectric layer as respective second gate dielectric layers on the floating gate and on the first gate dielectric layer of the selection transistor;

forming a second polysilicon layer on the respective second gate dielectric layers; and forming from the second polysilicon layer respective control gates of the selection transistor and the memory cell.

12. The process of claim 11 wherein the first gate dielectric layer is a tunnel oxide forming after forming a dielectric layer on the substrate and etching the dielectric layer to form a tunnel area.

13. The process of claim 11 wherein the first gate dielectric layer is a gate oxide layer.

14. The process of claim 11 wherein the first and second gate dielectric layers and the interpoly dielectric layer are grown.

15. The process of claim 11 wherein the first and second gate dielectric layers and the interpoly dielectric layer are deposited.

* * * * *